US012751117B2

(12) United States Patent
Niu et al.

(10) Patent No.: US 12,751,117 B2
(45) Date of Patent: Sep. 29, 2026

(54) LIGHT EMITTING SUBSTRATE, PREPARATION METHOD THEREFOR, AND DISPLAY DEVICE

(71) Applicant: BOE Technology Group Co., Ltd., Beijing (CN)

(72) Inventors: Yanan Niu, Beijing (CN); Yan Qu, Beijing (CN); Ming Yang, Beijing (CN); Jintao Peng, Beijing (CN); Bin Qin, Beijing (CN); Wanzhi Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 798 days.

(21) Appl. No.: 17/920,811

(22) PCT Filed: Nov. 30, 2021

(86) PCT No.: PCT/CN2021/134395
§ 371 (c)(1),
(2) Date: Oct. 24, 2022

(87) PCT Pub. No.: WO2023/097445
PCT Pub. Date: Jun. 8, 2023

(65) Prior Publication Data

US 2024/0222570 A1 Jul. 4, 2024

(51) Int. Cl.
*H10H 20/85* (2025.01)
*H10H 20/01* (2025.01)
(Continued)

(52) U.S. Cl.
CPC ...... *H10H 20/8506* (2025.01); *H10H 20/819* (2025.01); *H10H 20/853* (2025.01);
(Continued)

(58) Field of Classification Search
CPC ............ H10H 20/8506; H10H 20/819; H10H 20/853; H10H 20/857; H10H 20/0364;
(Continued)

(56) References Cited

U.S. PATENT DOCUMENTS 11,715,729 B2 * 8/2023 Lee ...................... H10W 90/00 257/72
2017/0154880 A1 * 6/2017 Ozeki .................. H10W 90/00
(Continued)

FOREIGN PATENT DOCUMENTS

CN 107039410 A 8/2017
CN 110176463 A 8/2019
(Continued)

OTHER PUBLICATIONS

Chinese First Office Action for Application No. 2021800036887, dated May 22, 2026, with English translation, 18 pgs.

*Primary Examiner* — Eliseo Ramos Feliciano
*Assistant Examiner* — Thaddeus J Kolb

(57) ABSTRACT

A light emitting substrate, a preparation method therefor, and a display device are provided. The light emitting substrate includes a base substrate, a die bonding structure, a light shielding structure and a light emitting chip disposed on the base substrate, wherein the light emitting chip is disposed at a side of the die bonding structure away from the base substrate, the light shielding structure is located at a peripheral side of the light emitting chip, the light emitting substrate further comprises a flux functional layer covering the side of the die bonding structure away from the base substrate, the light shielding structure comprises a shielding material layer and a partition structure, and the flux functional layer is blocked at the partition structure.

17 Claims, 5 Drawing Sheets

(51) Int. Cl.
*H10H 20/819* (2025.01)
*H10H 20/853* (2025.01)
*H10H 20/857* (2025.01)
*H10W 90/00* (2026.01)

(52) U.S. Cl.
CPC .......... *H10H 20/857* (2025.01); *H10W 90/00* (2026.01); *H10H 20/0364* (2025.01)

(58) Field of Classification Search
CPC .... H10H 20/85; H01L 25/0753; H10D 30/67; H10D 86/00
See application file for complete search history.

(56) References Cited

U.S. PATENT DOCUMENTS

| | | | | |
|---|---|---|---|---|
| 2019/0221728 | A1* | 7/2019 | Yu | H10H 20/8515 |
| 2025/0275335 | A1* | 8/2025 | Park | H10H 29/142 |

FOREIGN PATENT DOCUMENTS

| | | | |
|---|---|---|---|
| CN | 110416248 | A | 11/2019 |
| CN | 209896060 | U | 1/2020 |
| CN | 110998881 | A | 4/2020 |
| CN | 112490344 | A | 3/2021 |
| CN | 112599552 | A | 4/2021 |
| CN | 112687748 | A | 4/2021 |

* cited by examiner

LIGHT EMITTING SUBSTRATE, PREPARATION METHOD THEREFOR, AND DISPLAY DEVICE

CROSS-REFERENCE TO RELATED APPLICATION

The present application is a U.S. National Phase Entry of International Application PCT/CN2021/134395 having an international filing date of Nov. 30, 2021, and the contents disclosed in the above-mentioned application are hereby incorporated as a part of this application.

TECHNICAL FIELD

The present disclosure relates to, but is not limited to, the field of display technology, and more particularly, to a light emitting substrate, a method for preparing the light emitting substrate, and a display device.

BACKGROUND

With the development of chip manufacture and encapsulation technology, Micro Light Emitting Diode (Micro LED) has become a preferred research direction of the next generation display technology due to its remarkable advantages such as low power consumption, high color gamut, ultra-high resolution and ultra-thinness.

In a commonly used Micro LED transfer process, Micro LED is usually transferred directly to a drive backplate. Under the existing technology and structure, especially in front illumination, a front Micro LED is prone to light leakage on the back due to the obvious side light emitting caused by the deviation between morphology and design of the Micro LED, and a larger light emitting area of the side light emitting radiation path caused by residue of the sacrifice layer for transfer, which seriously affects the related yield of Micro LED.

SUMMARY

The following is a summary of subject matter described herein in detail. The summary is not intended to limit the protection scope of claims.

In a first aspect, an embodiment of the present disclosure provide a light emitting substrate, including a base substrate, a die bonding structure, a light shielding structure and a light emitting chip disposed on the base substrate, wherein the light emitting chip is disposed at a side of the die bonding structure away from the base substrate, the light shielding structure is located at a peripheral side of the light emitting chip, the light emitting substrate further includes a flux functional layer covering the side of the die bonding structure away from the base substrate, the light shielding structure includes a shielding material layer and a partition structure, and the flux functional layer is blocked at the partition structure.

In an exemplary embodiment, at least a part of the shielding material layer covers the partition structure.

In an exemplary embodiment, the partition structure includes a first side edge and a second side edge disposed on the base substrate, a partition groove is formed between the first side edge and the second side edge, and the shielding material layer fills at least a part of the partition groove.

In an exemplary embodiment, the die bonding structure includes a pad carrier, a second insulating layer disposed at a side of the pad carrier away from the base substrate, and a pad disposed at a side of the second insulating layer away from the base substrate, the light emitting chip is disposed on the pad, and the first side edge and/or the second side edge and the second insulating layer are integrally formed using a same material.

In an exemplary embodiment, a surface of the partition structure away from the base substrate is higher than a surface of the pad carrier away from the base substrate.

In an exemplary embodiment, the shielding material layer is disposed around a periphery of the light emitting chip.

In an exemplary embodiment, there is no overlapped region between an orthographic projection of the shielding material layer on the base substrate and an orthographic projection of the light emitting chip on the base substrate.

In an exemplary embodiment, an encapsulation layer is further included, which covers the light emitting chip, and a surface of the shielding material layer away from the base substrate is higher than a surface of the encapsulation layer away from the base substrate.

In an exemplary embodiment, the die bonding structure includes a pad carrier, a second insulating layer disposed at a side of the pad carrier away from the base substrate, and a pad disposed at a side of the second insulating layer away from the base substrate, the light emitting chip is disposed on the pad, the pad includes a first pad electrode and a second pad electrode which are disconnected from each other, the light emitting substrate further includes a connection electrode, a first lead and a first insulating layer, the connection electrode is located at a side of the first pad electrode close to the base substrate, there is an overlapped region between an orthographic projection of the connection electrode on the base substrate and an orthographic projection of the first pad electrode on the base substrate, the first lead is connected to at least one side of the connection electrode, the first insulating layer is disposed between the connection electrode and the first pad electrode, and the first insulating layer is provided with a first opening, the first opening exposes the connection electrode, and the first pad electrode is connected to the connection electrode through the first opening.

In an exemplary embodiment, the first lead and the connection electrode are integrally formed using a same material.

In an exemplary embodiment, the light emitting substrate further includes a light shielding layer located at a side of the connection electrode close to the base substrate, and there is an overlapped region between an orthographic projection of at least a part of the light shielding layer on the base substrate and the orthographic projection of the connection electrode on the base substrate.

In an exemplary embodiment, a second lead is further included, which is connected to at least one side of the second pad electrode, and the second lead and the second pad electrode are integrally formed using a same material.

In an exemplary embodiment, a cross section of the partition structure in a direction parallel to the base substrate is C-shaped, the second lead is located at a side of the partition structure away from the base substrate, and an orthographic projection of the second lead on the base substrate is not overlapped with an orthographic projection of the partition structure on the base substrate.

In an exemplary embodiment, the die bonding structure includes a pad carrier, a second insulating layer disposed at a side of the pad carrier away from the base substrate, and a pad disposed at a side of the second insulating layer away from the base substrate, the light emitting chip is disposed on the pad, the pad includes a first pad electrode and a second pad electrode which are disconnected from each other, the light emitting substrate further includes a first connection electrode, a first lead, a second connection electrode, a second lead and a first insulating layer which are disconnected from each other, the first connection electrode is located at a side of the first pad electrode close to the base substrate, there is an overlapped region between an orthographic projection of the first connection electrode on the base substrate and an orthographic projection of the first pad electrode on the base substrate, and the first lead is connected to at least one side of the first connection electrode; the second connection electrode is located at one side of the second pad electrode close to the base substrate, there is an overlapped region between an orthographic projection of the second connection electrode on the base substrate and an orthographic projection of the second pad electrode on the base substrate, and the second lead is connected to at least one side of the second connection electrode; the first insulating layer is located between the first connection electrode and the first pad electrode, and the first insulating layer is located between the second connection electrode and the second pad electrode, the first insulating layer is provided with a first opening, the first opening exposes the first connection electrode and the second connection electrode, the first pad electrode is connected to the first connection electrode through the first opening, and the second pad electrode is connected to the second connection electrode through the first opening.

In an exemplary embodiment, the light emitting substrate further includes a light shielding layer located at a side of the first connection electrode close to the base substrate, and the light shielding layer is located at a side of the second connection electrode close to the base substrate, and there is an overlapped region between an orthographic projection of at least a part of the light shielding layer on the base substrate and each of an orthographic projection of the first connection electrode on the base substrate and an orthographic projection of the second connection electrode on the base substrate.

In an exemplary embodiment, the light emitting chip includes at least one micro light emitting diode.

In a second aspect, an embodiment of the present disclosure further provides a method for preparing a light emitting substrate, including:

- forming a die bonding structure and a partition structure on a base substrate;
- forming a flux functional layer on the die bonding structure, and welding the light emitting chip to the die bonding structure, wherein the flux functional layer is blocked at the partition structure; and
- forming a shielding material layer on the partition structure;
- wherein the shielding material layer and the partition structure form a light shielding structure, and the light shielding structure is located at a peripheral side of the light emitting chip.

In an exemplary embodiment, forming the die bonding structure and the partition structure on the base substrate includes:

- forming a sacrifice layer and a pad carrier on the base substrate;
- forming a second insulating layer covering the sacrifice layer and the pad carrier on the base substrate, and forming a second opening in the second insulating layer, wherein the second opening exposes at least a part of the sacrifice layer; and
- removing the sacrifice layer through the second opening and retaining the second insulating layer on the sacrifice layer, wherein the second insulating layer on the sacrifice layer forms the partition structure.

In an exemplary embodiment, the sacrifice layer and the pad carrier are simultaneously formed on the base substrate through a halftone mask process.

In a third aspect, an embodiment of the present disclosure further provides a display device including the light emitting substrate described above.

Other aspects may be understood upon reading and understanding the drawings and the detailed description.

DETAILED DESCRIPTION

Figure 1:
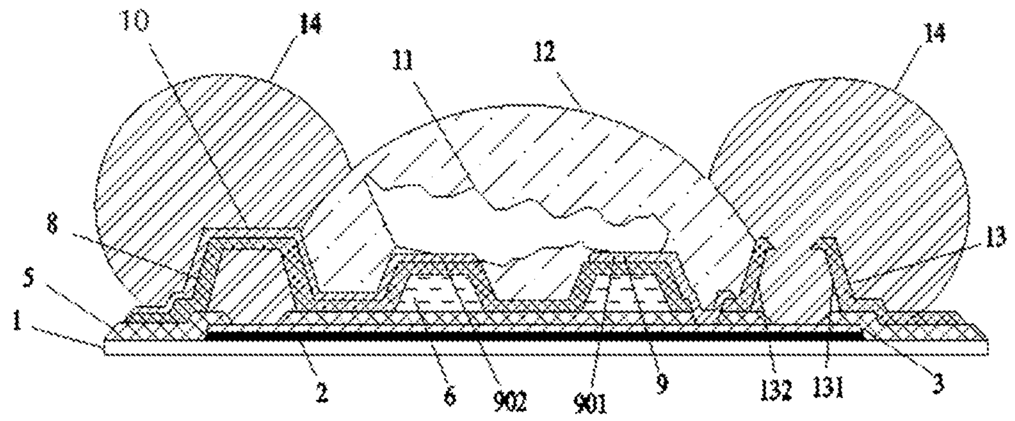
FIG. 1 is a first schematic diagram of a structure of a light emitting substrate according to an embodiment of the present disclosure.

The embodiments of the present disclosure will be described in detail below with reference to the drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the specification, for convenience, wordings indicating directional or positional relationships, such as “middle”, “upper”, “lower”, “front”, “back”, “vertical”, “horizontal”, “top”, “bottom”, “inside”, and “outside”, are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms “mount”, “mutually connect”, and “connect” should be understood in a broad sense. For example, a connection may be a fixed connection, or a detachable connection, or an integrated connection.

It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, “about” refers to that a boundary is defined not so strictly and numerical values within process and measurement error ranges are allowed.

At present, for a LED light emitting substrate, LED chips are usually miniaturized, arrayed, and thin-filmed by using a miniaturization process technology, and LED chips are transferred to a drive backplate in batches through a mass transfer technology. The LED light emitting substrate usually includes a drive backplate and multiple LED light emitting chips disposed on the drive backplate. According to the research of the applicant of the present disclosure, due to the deviation between morphology and design of the LED light emitting chips, it is prone to present an obvious side light emitting of the LED light emitting chips and a larger light emitting area of the side light emitting radiation path caused by the residue of the sacrifice layer for transfer, so that the LED light emitting substrate is prone to have a phenomenon of back light leakage. In the LED light emitting substrate of related art, the shielding performance of the LED light emitting substrate is poor due to mismatching of light shielding region and height of the drive backplate and the dirt at LED edge.

It has been discovered by the applicant of the present disclosure that an LED chip is usually welded to a pad using a leveling flux layer or a flux. In the welding process between the LED chip and the pad, a deposition range of the leveling flux layer or the flux is difficult to be controlled, prone to be deposited outside the die bonding region of the LED chip, however, there is a refractive index difference between the leveling flux layer or flux and the film layer located below it (in a direction close to the base substrate), and light emitted from the LED chip is refracted for multiple times and then emitted from a side of the base substrate facing away from the LED chip, resulting in light leakage from a side of the light emitting chip 11, and a larger residual area of the leveling flux layer or flux will lead to a larger light leakage range. However, it is difficult to limit the leveling flux layer or flux within a small range by ashing, and excessive ashing will lead to falling off of the LED chip and damage thereto.

FIG. 1 is a first schematic diagram of a structure of a light emitting substrate according to an embodiment of the present disclosure. As shown in FIG. 1, an embodiment of the present disclosure provides a light emitting substrate, including a base substrate 1, a die bonding structure, a light shielding structure and a light emitting chip 11 which are disposed on the base substrate 1. The light emitting chip 11 is disposed at a side of the die bonding structure away from the base substrate 1, and the light shielding structure is located at a peripheral side of the light emitting chip 11, the light emitting substrate further includes a flux functional layer covering the side of the die bonding structure away from the base substrate 1, the light shielding structure includes a shielding material layer 14 and a partition structure 13, and the flux functional layer is blocked at the partition structure 13.

In the embodiment of the present disclosure, the flux functional layer is blocked through by partition structure 13 in the light shielding structure, and the range of the flux functional layer is limited by the partition structure 13, thereby preventing the flux functional layer from flowing to a region other than the die bonding region of the light emitting chip 11, so that the problem of light leakage from a side of the light emitting chip 11 caused by the flux functional layer is solved.

In an exemplary embodiment, at least a part of the shielding material layer 14 covers the partition structure 13, that is, there is an overlapped region between an orthographic projection of the at least part of the shielding material layer 14 on the base substrate 1 and an orthographic projection of the partition structure 13 on the base substrate 1, thereby reducing an area occupied by the light shielding structure in a direction parallel to the base substrate 1 and saving space.

In an exemplary embodiment, the orthographic projection of the partition structure 13 on the base substrate 1 is within the orthographic projection of the shielding material layer 14 on the base substrate, i.e. the shielding material layer 14 covers the entire partition structure 13 and the shielding material layer 14 fills all partition grooves in the partition structure 13.

In an exemplary embodiment, the light emitting chip 11 may be a light emitting chip of a micro light emitting diode or a light emitting chip of a sub-millimeter light emitting diode. Each light emitting chip of micro light emitting diode may include multiple micro light emitting diodes (Micro LEDs) connected in series, and a typical size (e.g. length) of each micro light emitting diode may be less than 50 μm, e.g. 10 μm to 50 μm. Each light emitting chip of sub-millimeter light emitting diode may include multiple sub-millimeter light emitting diodes (Mini LEDs) connected in series, and a typical size (e.g. length) of each sub-millimeter light emitting diode may be about 50 μm to 150 μm, e.g. 80 μm to 120 μm.

In an exemplary embodiment, a shape of the light emitting chip 11 may be set in accordance with requirements. For example, a profile of the light emitting chip 11 in the direction parallel to the base substrate may be rectangular, so that zone control of the backlight source is more easily achieved.

In an exemplary embodiment, quantity and arrangement of light emitting chips on the drive backplate, and quantity and arrangement of the multiple light emitting diodes within a light emitting chip may be set according to actual conditions, which are not limited thereto in the present disclosure.

In an exemplary embodiment, the partition structure 13 includes a first side edge 131 and a second side edge 132 disposed on the base substrate 1, wherein the first side edge 131 is located at a side of the second side edge 132 away from the light emitting chip 11. A partition groove is formed between the first side edge 131 and the second side edge 132, and at least a part of the partition groove is filled with the shielding material layer, so that the shielding material layer in the partition groove can block the light emitted from a side of the light emitting chip 11 and avoid light leakage caused by the light emitted from the side of the light emitting chip 11 passing through the partition structure 13.

In an exemplary embodiment, the die bonding structure includes a pad carrier 6, a second insulating layer 8 disposed at a side of the pad carrier 6 away from the base substrate 1, and a pad 9 disposed at a side of the second insulating layer 8 away from the base substrate 1, and the light emitting chip 11 is welded on the pad 9. The pad carrier 6 is used for supporting the pad 9 and the light emitting chip 11. The pad 9 is made of an electrically conductive material, such as a metal, and is used for being electrically connected to the light emitting chip 11 to transmit a light emitting signal to the light emitting chip 11. The second insulating layer 8 is used for isolating the pad carrier 6 from the pad 9.

In an exemplary embodiment, the first side edge 131 and/or the second side edge 132 of the partition structure 13 and the second insulating layer 8 are integrally formed using a same material, i.e. the first side edge 131 and/or the second side edge 132 of the partition structure 13 and the second insulating layer 8 are prepared by a same preparation process using the same material. For example, both the first side edge 131 and the second side edge 132 are integrally formed with the second insulating layer 8 using the same material, so that the preparation process is simplified and the production cost is reduced.

In the exemplary embodiment, a surface of the partition structure 13 away from the base substrate 1 is higher than a surface of the pad carrier 6 away from the base substrate 1, i.e. a height of the partition structure 13 is greater than a height of the pad carrier 6 in a thickness direction of the base substrate 1. The partition structure 13 can effectively block overflowing of the flux functional layer.

In an exemplary embodiment, a cross section of the pad carrier 6 in a direction perpendicular to the base substrate 1 may take a variety of shapes. For example, the cross section of the pad carrier 6 in the direction perpendicular to the base substrate 1 may be trapezoidal, rectangular, or the like.

In an exemplary embodiment, the shielding material layer 14 may be annular, for example, rectangular annular. The shielding material layer 14 is disposed around the periphery of the light emitting chip 11, so that the shielding material layer 14 can block all the light emitted from the side of the light emitting chip 11 and avoid the light leakage from the side of the light emitting chip 11.

In the exemplary embodiment, there is no overlapped region between an orthographic projection of the shielding material layer 14 on the base substrate 1 and an orthographic projection of the light emitting chip 11 on the base substrate 1, thereby preventing the shielding material layer 14 from shielding the light emitting chip 11 in the direction perpendicular to the base substrate 1 and affecting the light emitting efficiency of the light emitting chip 11.

In an exemplary embodiment, the light emitting substrate of the present disclosure further includes an encapsulation layer 12 covering the light emitting chip 11, i.e., the encapsulation layer 12 is located at the side of the light emitting chip 11 away from the base substrate 1, and an orthographic projection of the encapsulation layer 12 on the base substrate 1 is overlapped with the orthographic projection of the light emitting chip 11 on the base substrate 1. The encapsulation layer 12 is used for protecting the light emitting chip 11.

In an exemplary embodiment, a surface of the shielding material layer 14 away from the base substrate 1 is higher than a surface of the encapsulation layer 12 away from the base substrate 1, so that the shielding material layer 14 has a better shielding effect.

In an exemplary embodiment, as shown in FIG. 1, the pad 9 includes a first pad electrode 901 and a second pad electrode 902 which are disconnected from each other, and the light emitting substrate further includes a connection electrode 3, a first lead and a first insulating layer 5. The connection electrode 3 is located at a side of the first pad electrode 901 close to the base substrate 1, and there is an overlapped region between an orthographic projection of the connection electrode 3 on the base substrate 1 and an orthographic projection of the first pad electrode 901 on the base substrate 1. The first lead is connected to at least one side of the connection electrode 3. For example, the first lead is connected to a side of the connection electrode 3 away from the light emitting chip 11, and the first lead extends in a direction away from the light emitting chip 11. The first insulating layer 5 is located between the connection electrode 3 and the first pad electrode 901. The first insulating layer 5 is provided with a first opening, the first opening exposes the connection electrode 3, and the first pad electrode 901 is connected to the connection electrode 3 through the first opening.

In an exemplary embodiment, the first lead and the connection electrode 3 can be integrally formed using a same material, i.e. the first lead and the connection electrode 3 can be prepared using the same material through the same preparation process, thus simplifying the preparation process and reducing the production cost.

In an exemplary embodiment, the light emitting substrate further includes a light shielding layer 2 located at a side of the connection electrode 3 close to the base substrate 1, and there is an overlapped region between an orthographic projection of at least a part of the light shielding layer 2 and the orthographic projection of the connection electrode 3 on the base substrate 1. The light shielding layer 2 is used for shielding the reflected light of the connection electrode 3. The light shielding layer 2 may be a black matrix (BM).

In an exemplary embodiment, the light emitting substrate further includes a second lead 10, wherein the second lead

10 is connected to at least one side of the second pad electrode 902, and is integrally formed with the second lead 10 and the second pad electrode 902 using a same material, i.e. the second lead 10 can be prepared with the second pad electrode 902 using the same material through a same preparation process, thus simplifying the preparation process and reducing the production cost.

In an exemplary embodiment, a cross section of the partition structure 13 in the direction parallel to the base substrate 1 is C-shaped, the second lead 10 is located at a side of the partition structure 13 away from the base substrate 1, and an orthographic projection of the second lead 10 on the base substrate 1 is not overlapped with the orthographic projection of the partition structure 13 on the base substrate 1.

Figure 2:
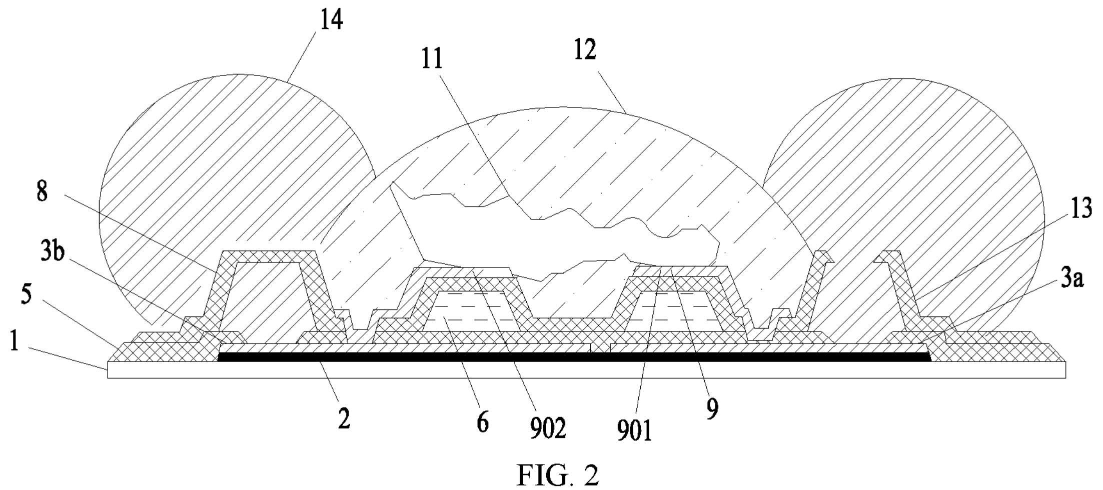
FIG. 2 is a second schematic diagram of a structure of a light emitting substrate according to an embodiment of the present disclosure.

FIG. 2 is a second schematic diagram of a structure of a light emitting substrate according to an embodiment of the present disclosure. In an exemplary embodiment, as shown in FIG. 2, the die bonding structure includes a pad carrier 6, a second insulating layer 8 disposed at a side of the pad carrier 6 away from the base substrate 1, and a pad 9 disposed at the side of the second insulating layer 8 away from the base substrate 1. The light emitting chip 11 is disposed on the pad 9. The pad 9 includes a first pad electrode 901 and a second pad electrode 902 which are disconnected from each other. The light emitting substrate further includes a first connection electrode 3*a*, a first lead, a second connection electrode 3*b*, a second lead and a first insulating layer 5 which are disconnected from each other. The first connection electrode 3*a* is located at a side of the first pad electrode 901 close to the base substrate 1, and there is an overlapped region between an orthographic projection of the first connection electrode 3*a* on the base substrate and an orthographic projection of the first pad electrode 901 on the base substrate. The first lead is connected to at least one side of the first connection electrode 3*a*, for example, the first lead is connected to the side of the first connection electrode 3*a* away from the second connection electrode 3*b*, and the first lead extends along a direction away from the second connection electrode 3*b*. The second connection electrode 3*b* is located at a side of the second pad electrode 902 close to the base substrate 1, and there is an overlapped region between an orthographic projection of the second connection electrode 3*b* on the base substrate and an orthographic projection of the second pad electrode 902 on the base substrate. The second lead is connected to at least one side of the second connection electrode 3*b*, for example, the second lead is connected to a side of the second connection electrode 3*b* away from the first connection electrode 3*a*, and the second lead extends in a direction away from the first connection electrode 3*a*. The first insulating layer 5 is located between the first connection electrode 3*a* and the first pad electrode 901, and the first insulating layer 5 is located between the second connection electrode 3*b* and the second pad electrode 902. There is an overlapped region between an orthographic projection of the first insulating layer 5 on the base substrate 1 and each of the orthographic projection of the first connection electrode 3*a* on the base substrate 1 and the orthographic projection of the second connection electrode 3*b* on the base substrate 1. The first insulating layer 5 is provided with first openings that expose the first connection electrode 3*a* and the second connection electrode 3*b*, the first pad electrode 901 is connected to the first connection electrode 3*a* through a first opening, and the second pad electrode 902 is connected to the second connection electrode 3*b* through a first opening.

In an exemplary embodiment, the first connection electrode 3*a* and the second connection electrode 3*b* may be prepared using a same material through a same preparation process. The preparation process is simplified and the production cost is reduced.

In an exemplary embodiment, as shown in FIG. 2, the light emitting substrate further includes a light shielding layer 2, wherein the light shielding layer 2 is located at a side of the first connection electrode close to the base substrate, and is located at a side of the second connection electrode close to the base substrate. There is an overlapped region between an orthographic projection of at least a part of the light shielding layer on the base substrate and each of the orthographic projection of the first connection electrode on the base substrate and the orthographic projection of the second connection electrode on the base substrate.

An embodiment of the present disclosure further provides a display device, including any one of the light emitting substrate described above. The display device in the embodiment of the present disclosure may be any product or component with a display function, such as a mobile phone, a tablet computer, a television, a display, a laptop computer, a digital photo frame, or a navigator.

An embodiment of the present disclosure further provides a method for preparing a light emitting substrate, including:

forming a die bonding structure and a partition structure on a base substrate;

forming a flux functional layer on the die bonding structure, and welding the light emitting chip to the die bonding structure, wherein the flux functional layer is blocked at the partition structure; and forming a shielding material layer on the partition structure;

wherein the shielding material layer and the partition structure form a light shielding structure, and the light shielding structure is located at a peripheral side of the light emitting chip.

In an exemplary embodiment, forming the die bonding structure and the partition structure on a base substrate includes:

forming a sacrifice layer and a pad carrier on the base substrate;

forming a second insulating layer covering the sacrifice layer and the pad carrier on the base substrate, and forming a second opening in the second insulating layer, wherein the second opening exposes at least a part of the sacrifice layer; and removing the sacrifice layer through the second opening and retaining the second insulating layer on the sacrifice layer, wherein the second insulating layer on the sacrifice layer forms the partition structure.

In an exemplary embodiment, the sacrifice layer and the pad carrier are simultaneously formed on the base substrate through a halftone mask process.

Exemplary description is made below through a preparation process of a light emitting substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a base substrate through a process such as deposition and coating. If the “thin film” does not need a patterning process in an entire preparation process, the “thin film” may also be called a “layer”. If the “thin film” needs a patterning process in an entire preparation process, it is called a “thin film” before the patterning process, and called a “layer” after the patterning process. The “layer” after the patterning process includes at least one “pattern”. “A and B are disposed in a same layer” in the present disclosure means that A and B are formed simultaneously through a same patterning processes, and a “thickness” of a film layer is a dimension of the film layer in a direction perpendicular to the drive backplate. In an exemplary embodiment of the present disclosure, “an orthogonal projection of A includes an orthogonal projection of B” refers to that a boundary of the orthogonal projection of B falls within a boundary of the orthogonal projection of A, or the boundary of the orthogonal projection of A is overlapped with the boundary of the orthogonal projection of B.

Figure 3:
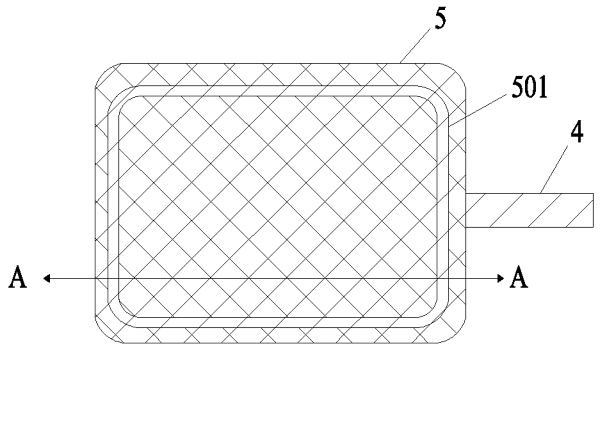
FIG. 3 is a first schematic diagram of a light emitting substrate after a pattern of a first conductive layer and a pattern of a light shielding layer are formed according to an embodiment of the present disclosure.
Figure 4:
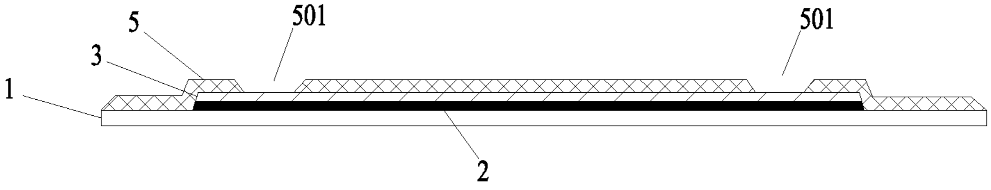
FIG. 4 is a first cross-sectional view of a light emitting substrate after a pattern of a first conductive layer and a pattern of a light shielding layer are formed according to an embodiment of the present disclosure.

FIG. 3 to FIG. 16 are schematic diagrams showing a preparation process of a light emitting substrate according to an embodiment of the present disclosure. The method for preparing a light emitting substrate according to the embodiment of the present disclosure, in particular, includes:

(1) forming a pattern of a first conductive layer and a pattern of a light shielding layer. In an exemplary embodiment, forming the pattern of the first conductive layer and the pattern of a light shielding layer may include: a light shielding thin film, a first conductive thin film and a first insulating thin film are sequentially deposited on the base substrate 1, the light shielding thin film, the first conductive thin film, and the first insulating thin film are sequentially patterned through a patterning process to form a light shielding layer 2 disposed on a base substrate 1, a pattern of a first conductive layer disposed on the light shielding layer 2, and a first insulating layer 5 disposed on the pattern of the first conductive layer. The pattern of the first conductive layer at least includes a connection electrode 3 and a first lead 4, and the first insulating layer 5 is provided with a first opening 501. The first opening 501 may be annular and exposes a surface of the connection electrode 3, as shown in FIG. 3 and FIG. 4, and FIG. 4 is a cross-sectional view taken along an A-A direction in FIG. 3.

In an exemplary embodiment, there is an overlapped region between an orthographic projection of the light shielding layer 2 on the base substrate 1 and an orthographic projection of the connection electrode 3 on the base substrate 1, and the light shielding layer 2 is used for shielding reflected light of the connection electrode 3. The light shielding layer 2 may be a black matrix (BM).

In an exemplary embodiment, the first lead 4 is connected to at least one side of the connection electrode 3, and an end of the first lead 4 away from the connection electrode 3 may be connected to a driving circuit for transmitting a light emitting signal to the light emitting chip through the connection electrode 3.

In an exemplary implementation, the first metal thin film may be made of a metal material, such as any one or more of silver (Ag), copper (Cu), aluminum (Al), titanium (Ti), molybdenum (Mo), chromium (Cr), tungsten (W), or an alloy material of the above metals, such as aluminum niobium alloy (AlNd) or molybdenum niobium alloy (MoNb), and may be in a single-layer structure, or a multi-layer metals, such as Mo/Cu/Mo, or may be in a stacked structure formed of metal and transparent conductive materials, such as ITO/Ag/ITO.

In an exemplary implementation, the first insulating layer 5 is an inorganic insulating layer, and may be made of any one or more of silicon oxide (SiOx), silicon nitride (SiNx), and silicon oxynitride (SiON), and may be in a single layer, multiple layers, or a composite layer, and the first insulating layer is referred to as a Passivation layer (PVX).

In an exemplary embodiment, the base substrate may be a rigid substrate or a flexible substrate, the rigid substrate may be glass or the like, and the flexible substrate may be polyimide (PI) or the like.

Figure 5:
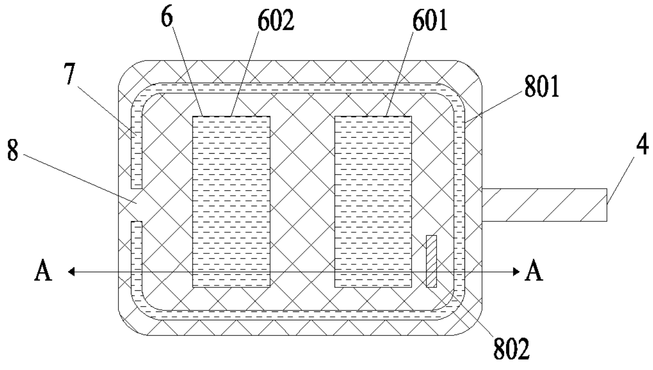
FIG. 5 is a schematic diagram of a light emitting substrate after a pattern of a pad carrier and a pattern of a sacrifice layer are formed according to an embodiment of the present disclosure.
Figure 6:
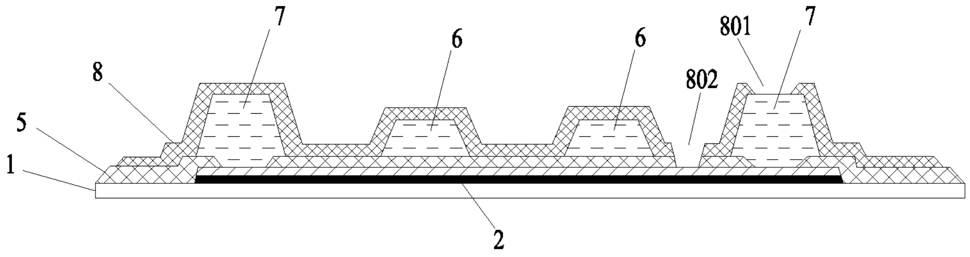
FIG. 6 is a first cross-sectional view of a light emitting substrate after a pattern of a pad carrier and a pattern of a sacrifice layer are formed according to an embodiment of the present disclosure.

(2) forming a pattern of a pad carrier and a pattern of a sacrifice layer. In an exemplary embodiment, forming the pattern of the pad carrier and the pattern of the sacrifice layer may include: on the base substrate 1 formed with the aforementioned patterns, a first material thin film is deposited on the first insulating layer 5 at first, and the first material thin film is formed into a pad carrier 6 through a coating process and a photolithography process. Then, a second material thin film is deposited on the first insulating layer 5, and the second material thin film is formed into a sacrifice layer 7 through a coating process and a photolithography process, and the sacrifice layer 7 is located at a side of the pad carrier 6 close to an edge of the base substrate 1. The bottom of the sacrifice layer 7 extends to the surface of the connection electrode 3 through the first opening 501. A second insulating thin film is then deposited on the first insulating layer 5, and the second insulating thin film is patterned by a patterning process so that the second insulating thin film is formed into a second insulating layer 8 covering the pad carrier 6 and the sacrifice layer 7. The second insulating layer 8 is provided with a second opening 801 and a third opening 802. An orthographic projection of the second opening 801 on the base substrate 1 is overlapped with an orthographic projection of a part of the sacrifice layer 7 on the base substrate 1, i.e. the second opening 801 exposes a surface of the part of the sacrifice layer 7. The third opening 802 is communicated with the first opening 501 and the third opening 802 exposes the connection electrode 3. An orthographic projection of the third opening 802 on the base substrate 1 is not overlapped with any of the orthographic projections of the pad carrier 6 and the sacrifice layer 7 on the base substrate 1, as shown in FIG. 5 and FIG. 6, and FIG. 6 is a cross-sectional view taken along a A-A direction in FIG. 5.

In some embodiments, the pad carrier 6 and the sacrifice layer 7 may be made of a same material and prepared simultaneously through a halftone mask process, thus simplifying the process and reducing the preparation cost.

In an exemplary embodiment, the sacrifice layer may be annular. The sacrifice layer 7 is disposed around the periphery of the pad carrier 6, i.e. the sacrifice layer 7 is disposed around the periphery of a first carrier seat 601 and a second carrier sear 602. The sacrifice layer 7 may be made of an organic material, such as resin.

In an exemplary embodiment, a distance from a surface of the sacrifice layer 7 away from the base substrate 1 to a surface of the base substrate 1 is greater than a distance from a surface of the pad carrier 6 away from the base substrate 1 to the surface of the base substrate 1, i.e., a height of the sacrifice layer 7 is greater than a height of the pad carrier 6 in a thickness direction of the base substrate 1. The sacrifice layer 7 has a function of restricting flowing of an encapsulation layer material and a function of blocking overflowing of a flux functional layer.

In an exemplary embodiment, the pad carrier 6 includes a first carrier seat 601 and a second carrier seat 602, which are disconnected from each other. The first carrier seat 601 and the second carrier seat 602 may take various shapes. For example, in a direction parallel to the base substrate 1, cross sections of the first carrier seat 601 and the second carrier seat 602 are both rectangular. The pad carrier 6 is used for supporting the pad and the light emitting unit. The pad carrier 6 may be made of an organic material, such as resin.

In an exemplary implementation, the first insulating layer 8 is an inorganic insulating layer, and may be made of any one or more of silicon oxide (SiOx), silicon nitride (SiNx), and silicon oxynitride (SiON), and may be in a single layer, multiple layers, or a composite layer.

In an exemplary embodiment, in a direction parallel to the base substrate 1, the second opening 801 is C-shaped, a part of the annular sacrifice layer 7 is not exposed by the second opening 801, and a second lead 10 may be disposed on the second insulating layer 8 covering the sacrifice layer 7 for leading out the second lead 10.

Figure 7:
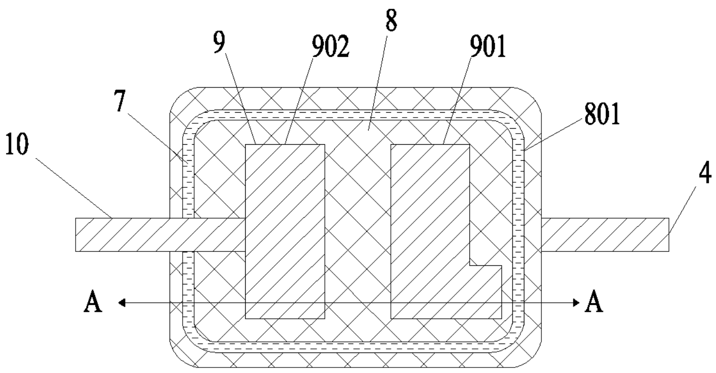
FIG. 7 is a schematic diagram of a light emitting substrate after a pattern of a pad is formed according to an embodiment of the present disclosure.
Figure 8:
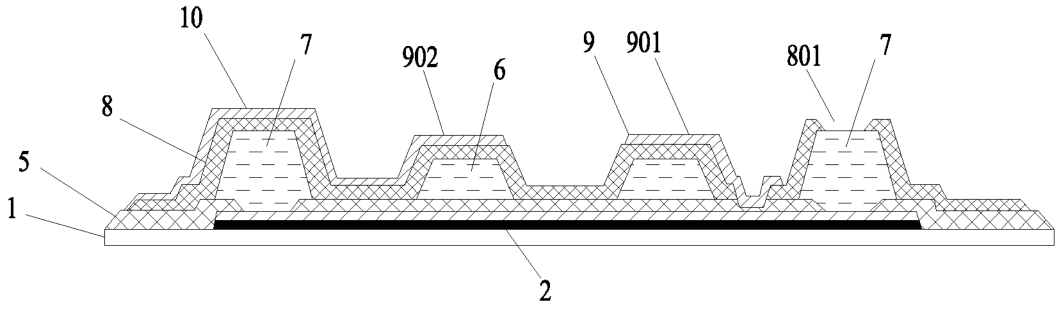
FIG. 8 is a first cross-sectional view of a light emitting substrate after a pattern of a pad is formed according to an embodiment of the present disclosure.

(3) forming a pattern of a pad. In an exemplary implementation, forming the pattern of the pad may include: on the base substrate 1 formed with the aforementioned patterns, a second conductive thin film is deposited on the second insulating layer 8 and the second conductive thin film is patterned through a patterning process, so that the second conductive thin film is formed into the pad 9 and the second lead 10. The pad 9 includes a first pad electrode 901 and a second pad electrode 902 which are disconnected from each other. The first pad electrode 901 covers the first carrier seat 601 and the third opening 802. The first pad electrode 901 extends to the surface of the connection electrode 3 through the third opening 802 and is connected to the connection electrode 3, so that the first lead 4 can guide a light emitting signal to the first pad electrode 901 through the connection electrode 3. The second pad electrode 902 covers the second carrier seat 602, and a side of the second pad electrode 902 away from the first pad electrode 901 is connected to the second lead 10. The second lead 10 covers a part of the sacrifice layer 7, the second lead 10 extends from the second pad electrode 902 in a direction away from the first pad electrode 901 and across the part of the sacrifice layer 7, and an orthographic projection of the second lead 10 on the base substrate 1 is not overlapped with the orthographic projection of the second opening 801 on the base substrate 1. An end of the second lead 10 away from the second pad electrode 902 may be connected to a driving circuit for guiding a light emitting signal to the second pad electrode 902, as shown in FIG. 7 and FIG. 8, and FIG. 8 is a cross-sectional view taken along a A-A direction in FIG. 7.

In an exemplary embodiment, the second metal thin film may be made of a metal material, such as silver (Ag), copper (Cu), aluminum (Al), molybdenum (Mo), or an alloy material of the above metals, such as aluminum niobium alloy (AlNd) or molybdenum niobium alloy (MoNb), may be in a single-layer structure, or a multi-layer composite structure, such as Mo/Cu/Mo, or may be in a stacked structure formed of metal and transparent conductive materials, such as ITO/Ag/ITO.

Figure 9:
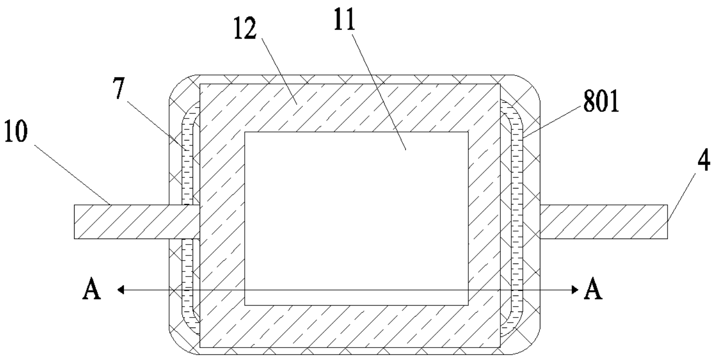
FIG. 9 is a schematic diagram of a light emitting substrate after a light emitting chip is transferred according to an embodiment of the present disclosure.

(4) transferring a light emitting chip. In an exemplary implementation, transferring the light emitting chip may include: on the base substrate 1 formed with the aforementioned patterns, the light emitting chip 11 is transferred, and die bonding and welding is performed on the light emitting chip 11, so that the light emitting chip 11 is welded to the pad 9. Specifically, the light emitting chip 11 includes a first electrode and a second electrode, the first electrode of the light emitting chip 11 is connected to the first pad electrode 901, and the second electrode of the light emitting chip 11 is connected to the second pad electrode 902, as shown in FIG. 9 and FIG. 10, and FIG. 10 is a cross-sectional view taken along a A-A direction in FIG. 9.

In the exemplary embodiment, during a welding process of the light emitting chip 11 and the pad 9, a flux functional layer 12 is deposited on the pad 9, and then the light emitting chip 11 is welded to the pad 9. The flux functional layer 12 may be a leveling flux layer or a flux.

Figure 10:
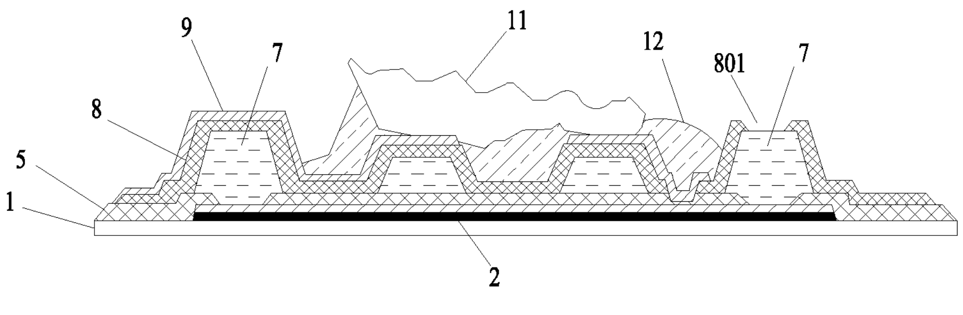
FIG. 10 is a cross-sectional view of a light emitting substrate after a light emitting chip is transferred according to an embodiment of the present disclosure.
Figure 11:
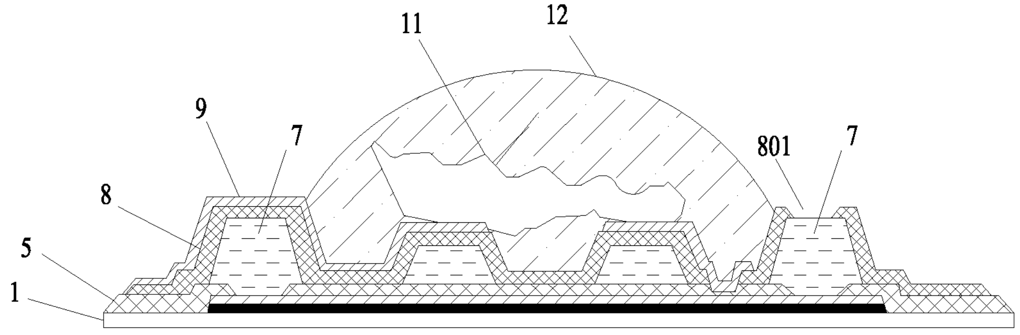
FIG. 11 is a cross-sectional view of a light emitting substrate after a pattern of an encapsulation layer is formed according to an embodiment of the present disclosure.

In this embodiment, the flux functional layer and the encapsulation layer are shown with employing the same material, so the flux functional layer in FIG. 10 and the encapsulation layer in FIG. 11 are both shown with the same reference numeral 12, and materials of the flux functional layer and the encapsulation layer may be different, which are not limited in the present disclosure.

(5) forming a pattern of an encapsulation layer. In an exemplary embodiment, forming the pattern of the encapsulation layer may include: on the base substrate 1 formed with the aforementioned patterns, an encapsulation thin film is deposited on the second insulating layer 8 through an ink-jet printing process, and the encapsulation thin film is patterned through a patterning process so that the encapsulation thin film is formed into the encapsulation layer 12 covering the light emitting chip 11, as shown in FIG. 11. The encapsulation layer 12 completely covers a sharp part of the light emitting chip 11, wherein a refractive index of the encapsulation layer 12 matches a refractive index of the light emitting chip 11.

Figure 12:
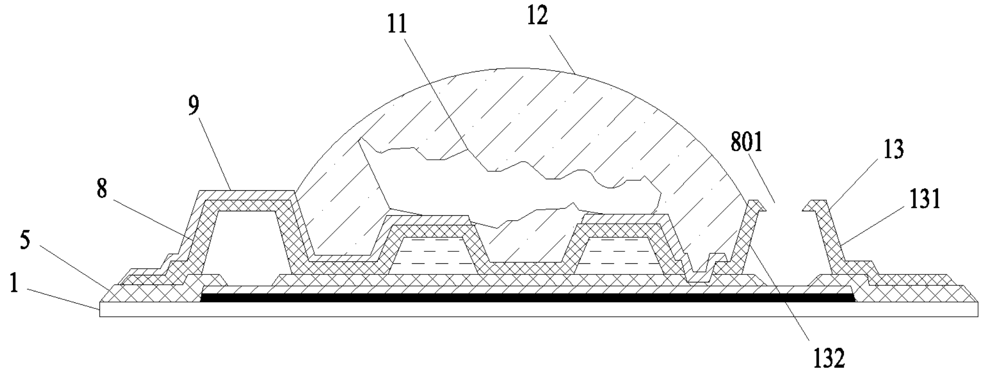
FIG. 12 is a cross-sectional view of a light emitting substrate after a pattern of a sacrifice layer is removed according to an embodiment of the present disclosure.

(6) removing the pattern of the sacrifice layer. In an exemplary embodiment, removing the pattern of the sacrifice layer may include: on the base substrate 1 formed with the aforementioned patterns, the sacrifice layer is etched away through the second opening 801, so that the second insulating layer 8 on the sacrifice layer is retained. After the sacrifice layer is removed, the second insulating layer 8 on the sacrifice layer is formed into a partition structure 13, as shown in FIG. 12. After the sacrifice layer is etched and removed, the flux functional layer 12 on the sacrifice layer will fall off following the sacrifice layer, so that the flux functional layer 12 is blocked at the partition structure 13, thereby solving the problem that the flux functional layer 12 causes light leakage at the side of the light emitting chip 11.

In an exemplary embodiment, a distance from a surface of the partition structure 13 away from the base substrate 1 to the base substrate 1 is greater than a distance from a surface of the encapsulation layer 12 away from the base substrate 1 to the base substrate 1, i.e., the surface of the partition structure 13 away from the base substrate 1 is higher than the surface of the encapsulation layer 12 away from the base substrate 1.

In an exemplary embodiment, the partition structure 13 includes a first side edge 131 and a second side edge 132 disposed oppositely, the second opening 801 is located between the top of the first side edge 131 and the top of the second side edge 132, and a partition groove is formed between the first side edge 131 and the second side edge 132, as shown in FIG. 12.

(7) forming a pattern of a shielding material layer. In an exemplary embodiment, forming the pattern of the shielding material layer may include: on the base substrate 1 formed with the aforementioned patterns, a shielding material is deposited on the outside of the encapsulation layer 12, the shielding material covers the partition structure 13, and at least a part of the shielding material fills the partition groove in the partition structure 13, and the shielding material is patterned through a patterning process, so that the shielding material is formed into a shielding material layer 14, as shown in FIG. 1. The shielding material layer 14 may be prepared using a black matrix at a normal temperature or a low temperature.

In an exemplary embodiment, the shielding material layer 14 may be annular, and may be disposed around the periphery of the light emitting chip 11. The shielding material layer 14 shields light emitted from the side of the light emitting chip 11 and prevents light leakage from the side of the light emitting chip 11.

In the exemplary embodiment, as shown in FIG. 1, the bottom of the shielding material layer 14 extends into the partition groove in the partition structure 13 and extends to the surface of the connection electrode 3 through the first opening 501 in the first insulating layer 5, so that light emitted from the side of the light emitting chip 11 is prevented from being emitted through the first insulating layer 5 and light leakage from the side of the light emitting chip 11 is prevented.

In an exemplary embodiment, a distance between a surface of the shielding material layer 14 away from the base substrate 1 and the surface of the base substrate 1 is greater than a distance between the surface of the encapsulation layer 12 away from the base substrate 1 and the surface of the base substrate 1, that is, a height of the shielding material layer 14 is greater than the height of the encapsulation layer 12 in the thickness direction of the base substrate 1, so as to improve a shielding efficiency of the shielding material layer 14.

Figure 13:
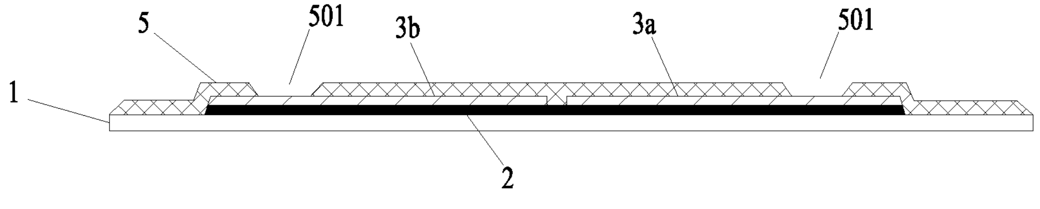
FIG. 13 is a second schematic diagram of a light emitting substrate after a pattern of a first conductive layer and a pattern of a light shielding layer are formed according to an embodiment of the present disclosure.
Figure 14:
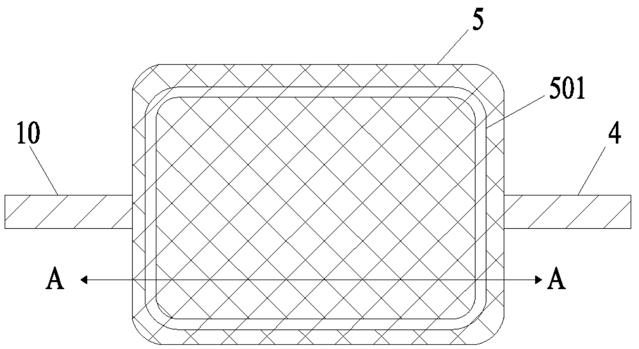
FIG. 14 is a second cross-sectional view of a light emitting substrate after a pattern of a first conductive layer and a pattern of a light shielding layer are formed according to an embodiment of the present disclosure.

In an exemplary embodiment, the embodiment of the present disclosure further provides a method for preparing a light emitting substrate, the method for preparing the light emitting substrate includes:

(1) forming a pattern of a first conductive layer pattern and a pattern of a light shielding layer. In an exemplary embodiment, forming the pattern of the first conductive layer and the pattern of the light shielding layer may include: a light shielding thin film, a first conductive thin film and a first insulating thin film are sequentially deposited on a base substrate 1, the light shielding thin film, the first conductive thin film, and the first insulating thin film are sequentially patterned through a patterning process to form a light shielding layer 2 disposed on the base substrate 1, a pattern of a first conductive layer disposed on the light shielding layer 2, and a first insulating layer 5 disposed on the pattern of the first conductive layer. The pattern of the first conductive layer at least includes a first connection electrode 3*a*, a second connection electrode 3*b*, a first lead 4, and a second lead 10. The first connection electrode 3*a* and the second connection electrode 3*b* are disconnected from each other. The first lead 4 is connected to the first connection electrode 3*a* and is located at a side of the first connection electrode 3*a* away from the second connection electrode 3*b*. The second lead 10 is connected to the second connection electrode 3*b* and is located at a side of the second connection electrode 3*b* away from the first connection electrode 3*a*. The first insulating layer 5 is provided with a first opening 501. The first opening 501 may be annular and exposes surfaces of the first connection electrode 3*a* and the second connection electrode 3*b*, as shown in FIG. 13 and FIG. 14, and FIG. 14 is a cross-sectional view taken along an A-A direction in FIG. 13.

Figure 15:
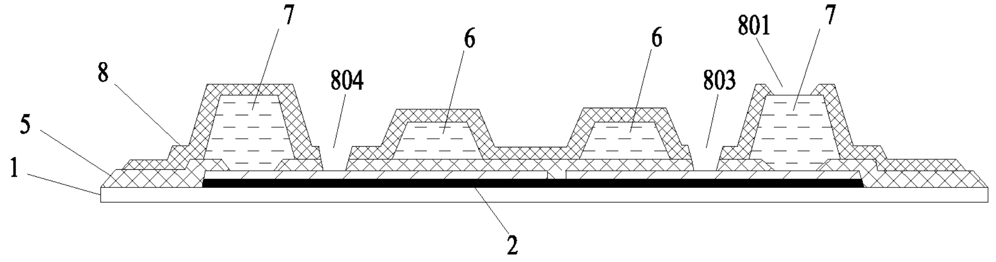
FIG. 15 is a second cross-sectional view of a light emitting substrate after a pattern of a pad carrier and a pattern of a sacrifice layer are formed according to an embodiment of the present disclosure.

(2) forming a pattern of a pad carrier and a pattern of a sacrifice layer. In an exemplary embodiment, forming the pattern of the pad carrier and the pattern of the sacrifice layer may include: on the base substrate 1 formed with the aforementioned patterns, a first material thin film is deposited on the first insulating layer 5 at first, and the first material thin film is formed into a pad carrier 6 through a coating process and a photolithography process. Then, a second material thin film is deposited on the first insulating layer 5, and the second material thin film is formed into a sacrifice layer 7 through the coating process and the photolithography process, and the sacrifice layer 7 is located at a side of the pad carrier 6 close to the edge of the base substrate 1. The bottom of the sacrifice layer 7 extends to a surface of the connection electrode 3*a* through the first opening 501. Then a second insulating thin film is deposited on the first insulating layer 5, and the second insulating thin film is patterned by a patterning process, so that the second insulating thin film is formed into a second insulating layer 8 covering the pad carrier 6 and the sacrifice layer 7. The second insulating layer 8 is provided with a second opening 801, a third opening 803, and a third opening 804. An orthographic projection of the second opening 801 on the base substrate 1 is overlapped with an orthographic projection of a part of the sacrifice layer 7 on the base substrate 1, i.e. the second opening 801 exposes a surface of the part of the sacrifice layer 7. The third opening 803 and the third opening 804 are both communicated with the first opening 501. An orthographic projection of the third opening 803 on the base substrate 1 is overlapped with an orthographic projection of the first connection electrode 3*a* on the base substrate 1, and the third opening 803 exposes the surface of the first connection electrode 3*a*. An orthographic projection of the third opening 804 on the base substrate 1 is overlapped with the orthographic projection of the second connection electrode 3*b* on the base substrate 1, and the third opening 804 exposes a surface of the second connection electrode 3*b*, as shown in FIG. 15.

Figure 16:
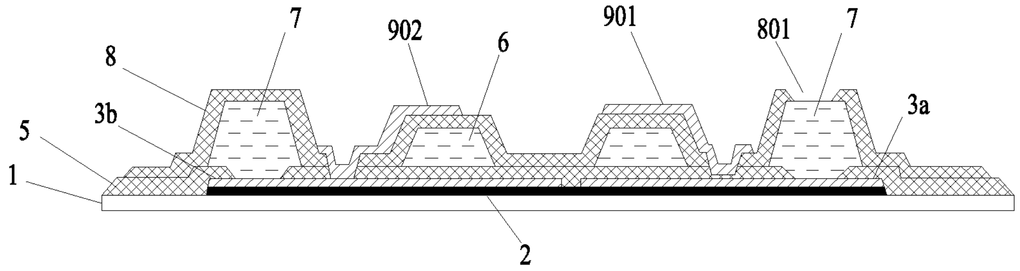
FIG. 16 is a second cross-sectional view of a light emitting substrate after a pattern of a pad is formed according to an embodiment of the present disclosure.

(3) forming a pattern of a pad. In an exemplary implementation, forming the pattern of the pad may include: on the base substrate 1 formed with the aforementioned patterns, a second conductive thin film is deposited on the second insulating layer 8 and the second conductive thin film is patterned through a patterning process, so that the second conductive thin film is formed into the pad 9. The pad 9 includes a first pad electrode 901 and a second pad electrode 902 which are disconnected from each other, the first pad electrode 901 covers a first carrier seat 601 and the third opening 803, the first pad electrode 901 extends to the surface of the first connection electrode 3*a* through the third opening 803 and is connected to the first connection electrode 3*a*, so that the first lead 4 can guide a light emitting signal to the first pad electrode 901 through the first connection electrode 3*a*. The second pad electrode 902 covers the second carrier seat 602 and the third opening 804, the second pad electrode 902 extends to the surface of the second connection electrode 3*b* through the third opening 804 and is connected to the second connection electrode 3*b*, so that the second lead 10 can guide a light emitting signal to the second pad electrode 902 through the second connection electrode 3*b*, as shown in FIG. 16.

A preparation process following the method for preparing the light emitting substrate according to the embodiment of the present disclosure is the same as the preparation process of the method for preparing the light emitting substrate according to the preceding embodiments, and which is not repeated here in the embodiment of the present disclosure.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A light emitting substrate, comprising a base substrate, a die bonding structure, a light shielding structure and a light emitting chip disposed on the base substrate, wherein the light emitting chip is disposed at a side of the die bonding structure away from the base substrate, the light shielding structure is located at a peripheral side of the light emitting chip, the light emitting substrate further comprises a flux functional layer covering the side of the die bonding structure away from the base substrate, the light shielding structure comprises a shielding material layer and a partition structure, and the flux functional layer is blocked at the partition structure; and wherein at least a part of the shielding material layer covers the partition structure;

the partition structure comprises a first side edge and a second side edge disposed on the base substrate, a partition groove is formed between the first side edge and the second side edge, and the shielding material layer fills at least a part of the partition groove; and the die bonding structure comprises a pad carrier, a second insulating layer disposed at a side of the pad carrier away from the base substrate, and a pad disposed at a side of the second insulating layer away from the base substrate, the light emitting chip is disposed on the pad, and the first side edge and/or the second side edge and the second insulating layer are integrally formed using a same material.

2. The light emitting substrate according to claim 1, wherein a surface of the partition structure away from the base substrate is higher than a surface of the pad carrier away from the base substrate.

3. The light emitting substrate according to claim 1, wherein the shielding material layer is disposed around a periphery of the light emitting chip.

4. The light emitting substrate according to claim 1, wherein there is no overlapped region between an orthographic projection of the shielding material layer on the base substrate and an orthographic projection of the light emitting chip on the base substrate.

5. The light emitting substrate according to claim 1, wherein the pad comprises a first pad electrode and a second pad electrode which are disconnected from each other, the light emitting substrate further comprises a connection electrode, a first lead and a first insulating layer, the connection electrode is located at a side of the first pad electrode close to the base substrate, there is an overlapped region between an orthographic projection of the connection electrode on the base substrate and an orthographic projection of the first pad electrode on the base substrate, the first lead is connected to at least one side of the connection electrode, the first insulating layer is disposed between the connection electrode and the first pad electrode, and the first insulating layer is provided with a first opening, the first opening exposes the connection electrode, and the first pad electrode is connected to the connection electrode through the first opening.

6. The light emitting substrate according to claim 5, wherein the first lead and the connection electrode are integrally formed using a same material.

7. The light emitting substrate according to claim 5, wherein the light emitting substrate further comprises a light shielding layer located at a side of the connection electrode close to the base substrate, and there is an overlapped region between an orthographic projection of at least a part of the light shielding layer on the base substrate and the orthographic projection of the connection electrode on the base substrate.

8. The light emitting substrate according to claim 5, further comprising a second lead connected to at least one side of the second pad electrode, and the second lead and the second pad electrode are integrally formed using a same material.

9. The light emitting substrate according to claim 8, wherein a cross section of the partition structure in a direction parallel to the base substrate is C-shaped, the second lead is located at a side of the partition structure away from the base substrate, and an orthographic projection of the second lead on the base substrate is not overlapped with an orthographic projection of the partition structure on the base substrate.

10. The light emitting substrate according to claim 1, wherein the pad comprises a first pad electrode and a second pad electrode which are disconnected from each other, the light emitting substrate further comprises a first connection electrode, a first lead, a second connection electrode, a second lead and a first insulating layer which are disconnected from each other, the first connection electrode is located at a side of the first pad electrode close to the base substrate, there is an overlapped region between an orthographic projection of the first connection electrode on the base substrate and an orthographic projection of the first pad electrode on the base substrate, and the first lead is connected to at least one side of the first connection electrode; the second connection electrode is located at one side of the second pad electrode close to the base substrate, there is an overlapped region between an orthographic projection of the second connection electrode on the base substrate and an orthographic projection of the second pad electrode on the base substrate, and the second lead is connected to at least one side of the second connection electrode; the first insulating layer is located between the first connection electrode and the first pad electrode, and the first insulating layer is located between the second connection electrode and the second pad electrode, the first insulating layer is provided with a first opening, the first opening exposes the first connection electrode and the second connection electrode, the first pad electrode is connected to the first connection electrode through the first opening, and the second pad electrode is connected to the second connection electrode through the first opening.

11. The light emitting substrate according to claim 10, wherein the light emitting substrate further comprises a light shielding layer located at a side of the first connection electrode close to the base substrate, and the light shielding layer is located at a side of the second connection electrode close to the base substrate, and there is an overlapped region between an orthographic projection of at least a part of the light shielding layer on the base substrate and each of an orthographic projection of the first connection electrode on the base substrate and an orthographic projection of the second connection electrode on the base substrate.

12. The light emitting substrate according to claim 1, wherein the light emitting chip comprises at least one micro light emitting diode.

13. A method for preparing the light emitting substrate according to claim 1, comprising:

forming the die bonding structure and the partition structure on the base substrate;

forming the flux functional layer on the die bonding structure, and welding the light emitting chip to the die bonding structure; and forming the shielding material layer on the partition structure.

14. The method for preparing the light emitting substrate according to claim 13, wherein forming the die bonding structure and the partition structure on the base substrate comprises:

forming a sacrifice layer and a pad carrier on the base substrate;

forming a second insulating layer covering the sacrifice layer and the pad carrier on the base substrate, and forming a second opening in the second insulating layer, wherein the second opening exposes at least a part of the sacrifice layer; and removing the sacrifice layer through the second opening and retaining the second insulating layer on the sacrifice layer, wherein the second insulating layer on the sacrifice layer forms the partition structure.

15. The method for preparing the light emitting substrate according to claim 14, wherein the sacrifice layer and the pad carrier are simultaneously formed on the base substrate through a halftone mask process.

16. A display device, comprising the light emitting substrate according to claim 1.

17. The light emitting substrate according to claim 1, wherein the light emitting substrate further comprises an encapsulation layer covering the light emitting chip, and a surface of the shielding material layer away from the base substrate is higher than a surface of the encapsulation layer away from the base substrate.

* * * * *